Dec. 19, 1950

E. L. HALL 2,534,768

TELEVISION TUNER

Filed Oct. 8, 1948

3 Sheets-Sheet 1

INVENTOR.
Emery L. Hall,
BY
Foorman L. Mueller
Atty.

Dec. 19, 1950 E. L. HALL 2,534,768

TELEVISION TUNER

Filed Oct. 8, 1948 3 Sheets-Sheet 2

INVENTOR.
Emery L. Hall,
BY
Foorman L. Mueller
Atty.

Dec. 19, 1950 E. L. HALL 2,534,768

TELEVISION TUNER

Filed Oct. 8, 1948 3 Sheets-Sheet 3

INVENTOR.
Emery L. Hall,
BY
Foorman L. Mueller
Atty.

UNITED STATES PATENT OFFICE 2,534,768

TELEVISION TUNER

Emery L. Hall, La Grange, Ill., assignor to Belmont Radio Corporation, Chicago, Ill., a corporation of Illinois Application October 8, 1948, Serial No. 53,447

8 Claims. (Cl. 250—40)

This invention relates generally to tuning mechanisms and more particularly to a simple mechanical system for a television tuner.

Television broadcasting is practiced on a plurality of channels which are provided in two non-contiguous frequency ranges. The electrical tuning systems for receiving television signals, therefore, must be capable of being adjusted to respond to channels in these two different frequency ranges. Tuners in present use have been of two general types, the first in which separate electrical tuning components are provided for each channel and the second in which continuously variable tuning elements are provided for tuning within each frequency range, and switching means are utilized to select the desired frequency range. The first system has the disadvantage that a very large number of different tuning elements are required and due to the very high frequencies involved the elements themselves and also the means for switching elements produce stray reactances which cause undesirable effects. The cost of such tuners is relatively great as each of the individual tuning elements must be very accurately constructed. Tuners in which the frequency range is selected by switching means and the elements are continuously variable have been undesirable because two separate switching controls are required and improper setting of the continuously tunable elements by the user is likely to occur causing poor reception.

It is, therefore, an object of the present invention to provide a television tuner of the continuously tunable type in which a single control is effective to accurately select any channel in either frequency range.

A further object of this invention is to provide an improved tuner in which a single mechanical control operates switching means for selecting the desired frequency range and also adjusts the tuning element for selecting predetermined channels in each range.

A still further object of this invention is to provide a mechanical operating mechanism for a television tuner which provides accurate setting of continuously variable elements and which is constructed of simple non-critical parts.

A feature of this invention is the provision of a television tuning mechanism including first cam means for selecting one of a plurality of frequency ranges and second cam means for selecting stations within each frequency range.

A further feature of this invention is the provision of a mechanical tuning system including means for selecting a frequency range and cam means having adjustable members providing for variously positioning tuning elements for selecting the individual channels in the frequency range selected.

A still further feature of this invention is the provision of a tuning mechanism including a station selector cam formed of discs with screws adjustably positioned therein to provide a variable camming surface. Locking means are provided for preventing unintentional adjustment of the screws and a detent cooperates with the discs for holding the cam in the selected position.

Further objects, features and advantages will be apparent from a consideration of the following description when taken in connection with the accompanying drawings in which.

Figure 1:
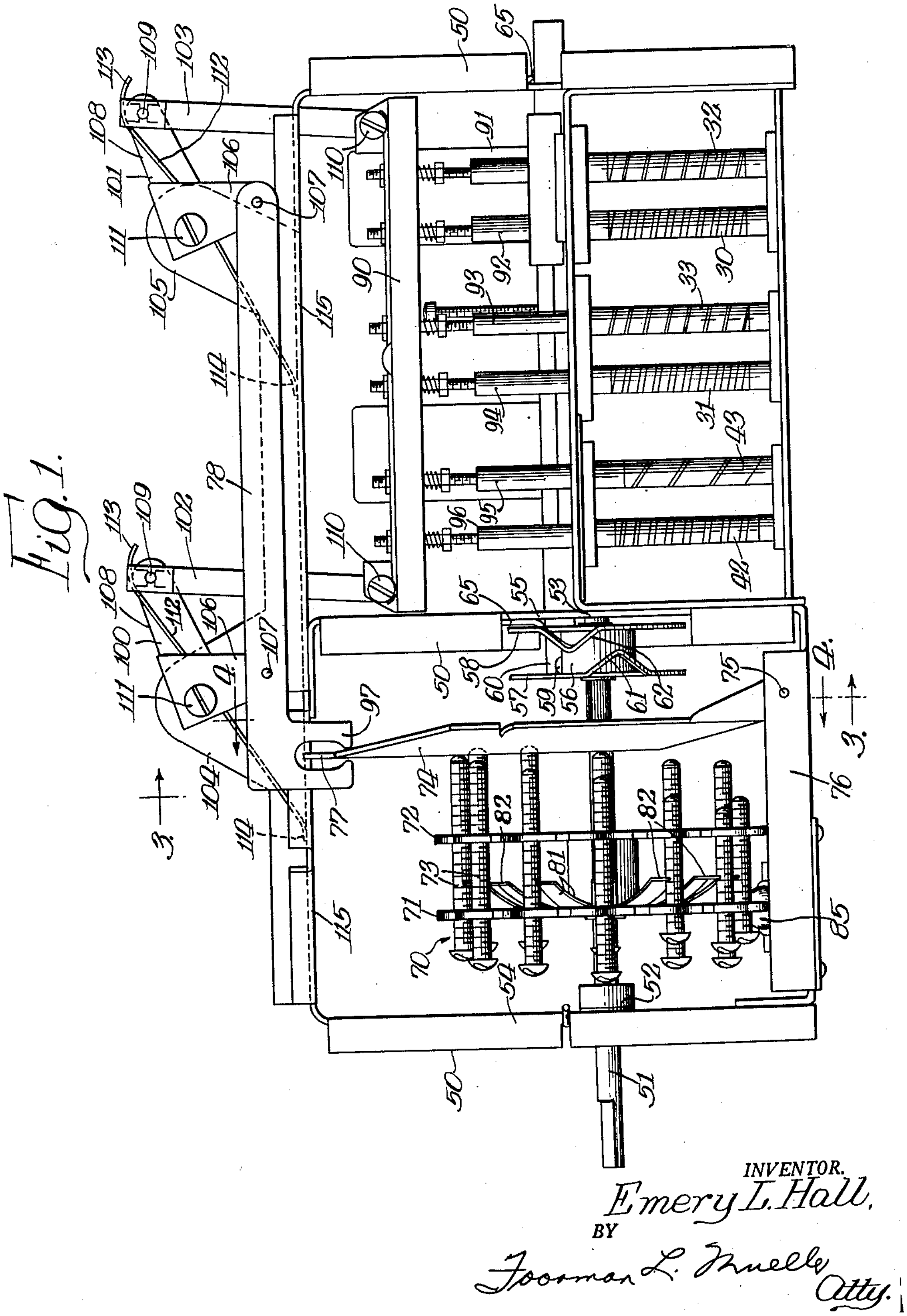
Fig. 1 is a side view illustrating the tuner in accordance with the invention.
Figure 3:
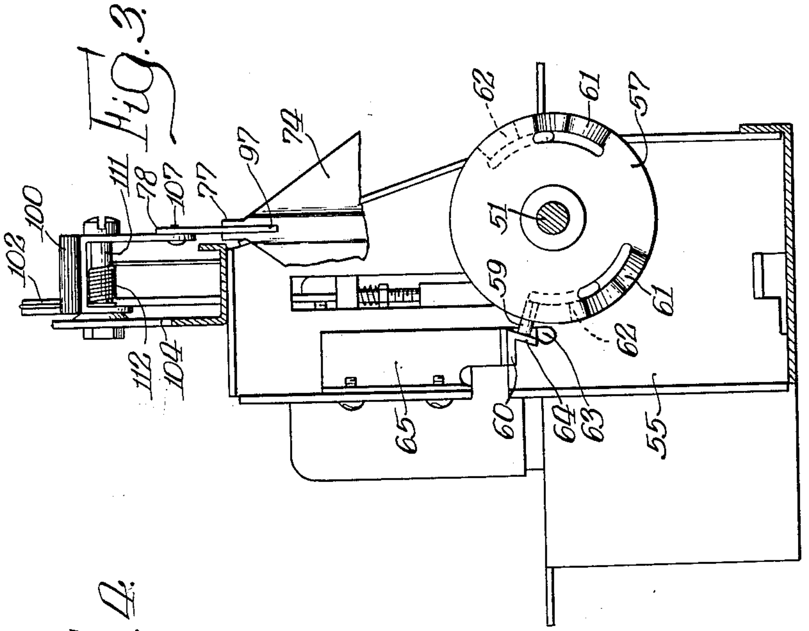
Figures 4, 5:
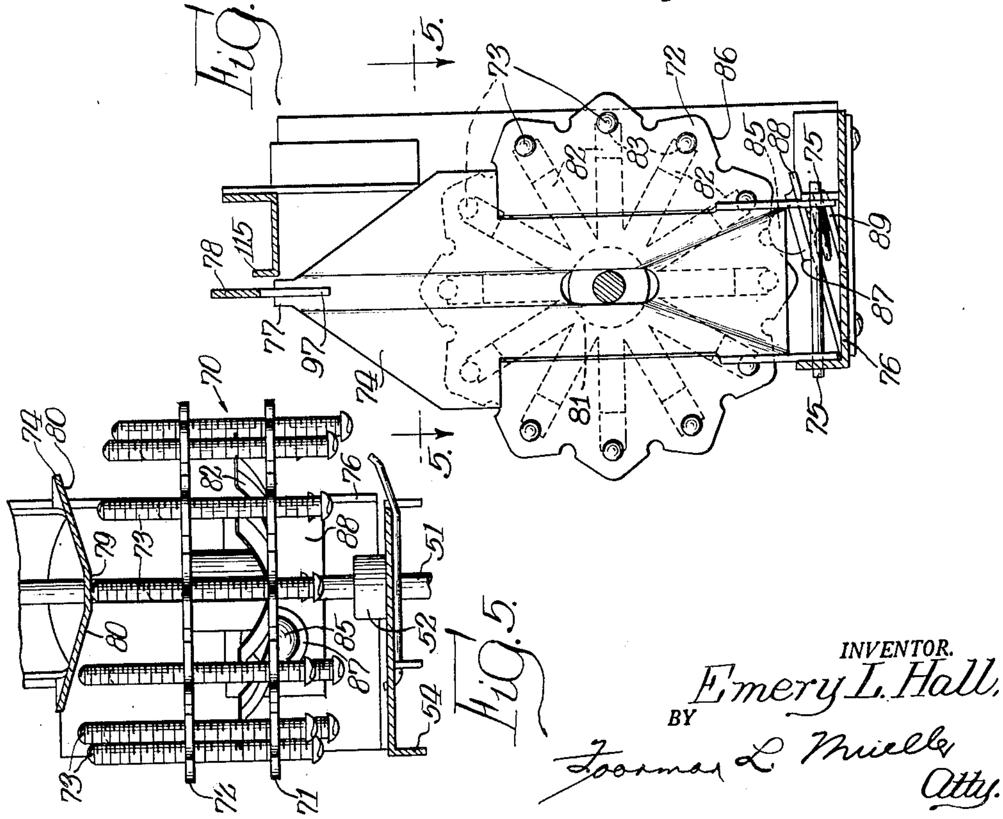

Figs. 3 and 4 are cross-sectional views along the lines 3—3 and 4—4 of Fig. 1 respectively; and Fig. 5 is a cross-sectional view along the lines 5—5 of Fig. 4.

In practicing the invention a mechanical operating system is provided for a television tuner which includes switching means for selecting either the low or high frequency range, and movable iron core inductance elements are used for selecting any channel within each frequency range. The tuning mechanism includes a rotatable shaft having first cam means for operating the switching means so that each of the frequency ranges is selected as the shaft is rotated through different segments. Second cam means is provided including a pair of discs secured to the shaft into which screws are threaded to provide an adjustable camming surface. A cradle arm is provided which bears against one of the screws and which is mechanically interconnected with the movable cores for adjusting the position thereof in accordance with the position of the screw. By rotation of the shaft the screws are selectively brought into engagement with the cradle arm so that the cores take the various positions corresponding to the individual screws. Locking means is provided for preventing unintentional movement of the screws with respect to the discs and a detent bears against an irregular edge of one of the discs for holding the shaft in any one of a plurality of fixed positions which correspond to the various channels.

Figure 2:
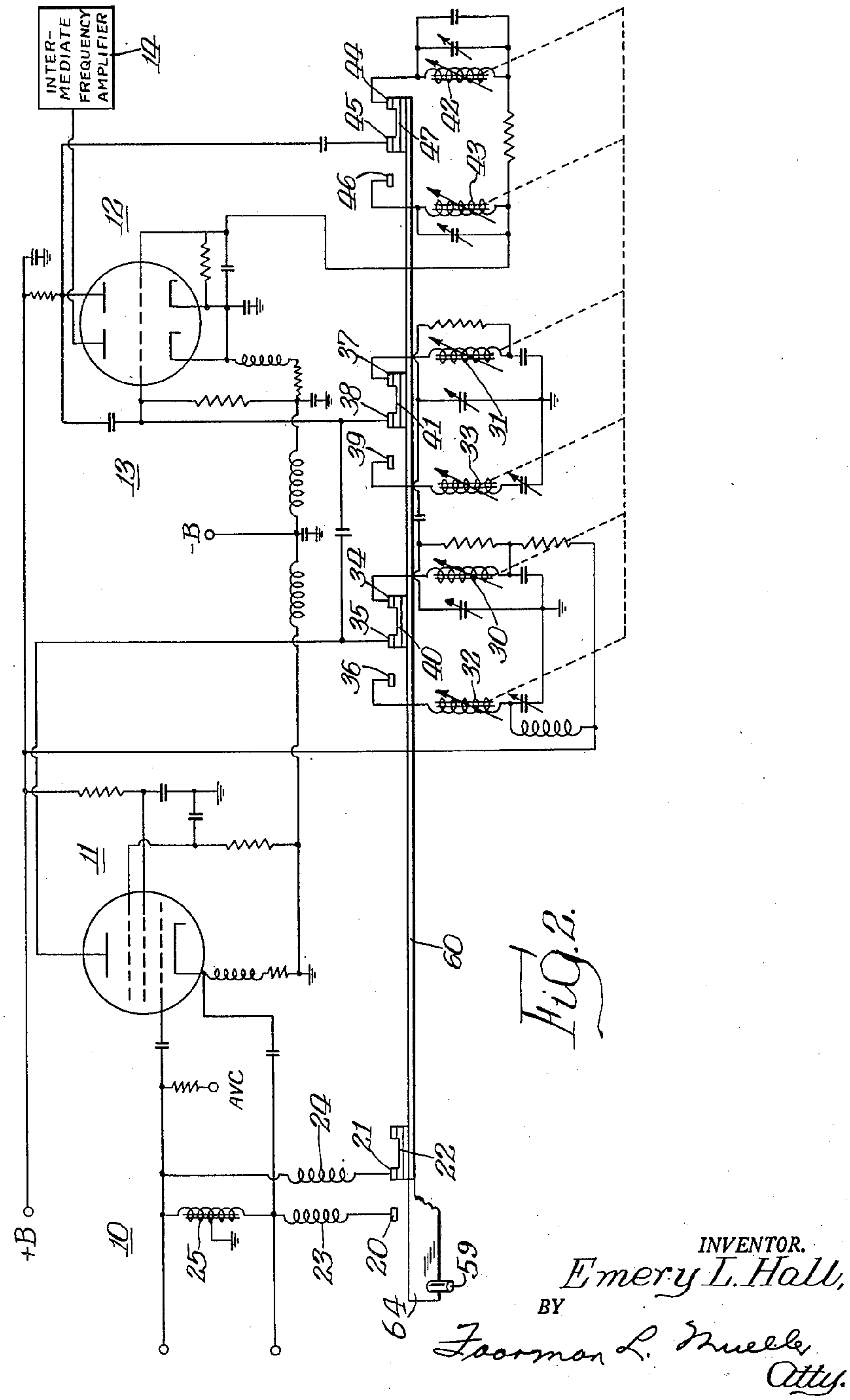
Fig. 2 is a circuit diagram illustrating a circuit which may be controlled by the tuner.

Referring now to the drawings, Fig. 1 illustrates the tuner in accordance with the invention and Fig. 2 illustrates the schematic diagram thereof. Before describing the mechanical operating mechanism which is the subject matter of this invention, a brief description of the operations to be performed thereby is believed to be necessary to an understanding of the invention. This is illustrated by the circuit of Fig. 2 in which 10 represents the antenna coupling circuit, 11 is the radio frequency amplifier, 12 the oscillator, 13 the mixer, and 14 the intermediate frequency amplifier. The antenna coupling circuit includes switch contacts 20 and 21 selectively engaged by movable contact 22 for bridging the coils 23 and 24 across the coil 25. The movable contact 22 is shown in the position for low frequency operation in which the coil 25 provides the desired coupling impedance. For operation on the high frequency range, the contact 22 is moved to the left to bridge the coils 23 and 24 in series across coil 25.

The radio frequency amplifier 11 includes a frequency selective circuit including movable iron core inductors 30 and 31 for tuning the circuit in the low frequency range and inductors 32 and 33 for tuning the circuit in the high frequency range. Switch contacts 34, 35, 36, 37, 38 and 39 are provided for selectively coupling the various resonant circuits. Movable contacts 40 and 41, in the position shown, connect the resonant circuits including inductors 30 and 31 for operation on the low frequency range. When operation on the high frequency range is desired, the movable contacts 40 and 41 are moved to the left to bridge fixed contacts 35 and 36, and 38 and 39, respectively.

The oscillator 12 includes movable iron core inductors 42 and 43 for operation on the low and high frequency ranges respectively. Fixed contacts 44, 45 and 46 and movable contact 47 provide the desired connections. In the position shown, the movable contact 47 couples the low frequency circuit including inductor 42, and when the movable contact 47 is moved to the left the inductor 43 is connected for operation on the high frequency range. Detailed description of the operation of the circuit of Fig. 2 is not believed necessary for an understanding of this invention. This circuit is described and claimed in the copending application of Louis W. Schreiner, Serial No. 53,458, filed October 8, 1948, now U. S. Patent No. 2,503,073, granted April 4, 1950, entitled "Television Tuning System."

Considering now the structure of the tuner more in detail (Figs. 1, 3, 4 and 5), the tuner is supported on a frame 50 which is made of a plurality of sheet metal members. A shaft 51 is rotatably mounted on the frame being supported in bearings 52 and 53 in the vertically extended portions 54 and 55, respectively, of the frame. The shaft 51 carries a first camming means 56 which may include parallel discs 57 and 58 between which a pin 59 carried by a slidable switch arm 60 extends. The parallel discs 57 and 58 have punched out camming surfaces 61 and 62, respectively, which engage the pin 59 for causing a sliding action of the switch arm 60. The switch arm 60 carries the movable switch contacts 22, 40, 41 and 47 for providing the switching operations described in connection with Fig. 2. The structure of the switch contacts is not illustrated as any suitable structure may be used.

Fig. 3 illustrates more in detail the switch operating mechanism. The slidable switch arm 60 is angle shaped and is positioned in a slot 63 in the vertical frame member 55. The end portion of the angle-shaped arm is bent as indicated at 64 so that the pin 59 extends along a radius of the discs 57 and 58. Two adjustable guide members 65 are secured to the frame 50 and bear on the top of the slidable arm 60 at the ends thereof to hold the arm in position (Fig. 1). Each disc 57 and 58 includes a pair of camming surfaces so that during a first sector of rotation of the shaft 51 the slidable arm 60 is in one position and during the remaining sector the slidable arm is in a second position. The arm will be operated in the desired manner regardless of the direction of rotation of the shaft 51. It is obvious that various other cam arrangements may be used to provide the desired operation.

Supported on the rotatable shaft 51 is a second camming means 70 comprising a pair of discs 71 and 72. A plurality of screws 73 are threaded into the discs 71 and 72 at regularly spaced intervals as illustrated in Fig. 4. The rounded ends of the screws form in effect a camming surface, with rotation of the shaft causing the various screws 73 to engage the cradle arm 74 for moving the same. The cradle arm 74 is pivoted at 75 to the lower frame member 76 and has an upper end 77 which engages a projection 97 on rocker member 78 for adjusting the position of the rocker member. Fig. 5 is a cross-sectional view along the lines 5—5 of Fig. 4, showing the manner in which the screws 73 engage the arm 74 to provide a camming action. The arm includes a relatively flat portion 79 so that the exact position of engagement of a screw 73 with the arm is not critical. The sides 80 of the arm are bent back so that the screw 73 adjacent to the one in engagement with the arm (and which may extend farther than the screw engaging the arm) will not engage the arm 74 to thereby affect the position thereof.

As clearly shown in Figs. 1 and 4, a locking spring member 81 is provided on the camming means 70 for engaging the individual screws 73 to prevent unintentional adjustment thereof. The spring means includes individual fingers 82 having semicircular engaging surfaces 83 which bear in the threads of the individual screws. It is to be noted that various other locking arrangements may be provided to prevent undesired movement of the screws. In order to hold the shaft in the various positions corresponding to the various channels, a detent arrangement is provided including a ball 85 which engages regularly spaced depressions 86 in the edge of the disk 71. The ball 85 rests in an opening 87 in angularly extending member 88 which is secured to the bottom frame member 76. A spring 89 bears against the ball to urge it firmly against the depressions 86 so that the camming means 70 is held in an exact rotational position. This in turn holds the shaft 51 and the camming means 56 in predetermined positions.

The position of the various screws 73 is effective through the cradle arm 74 and rocker member 78 to control the position of the carriage 90 by which the cores 91, 92, 93, 94, 95 and 96 are supported. These cores are the movable cores of the inductance units 32, 30, 33, 31, 43 and 42 (Fig. 2), respectively. This motion is transmitted through cranks 100 and 101 and connecting rods 102 and 103. The cranks are pivotally supported on projections 104 and 105 which extend upwardly from the top of the frame by bolts 111. The cranks 100 and 101 include downwardly extending arms 106 which are pivotally connected to the rocker member 78 at 107 for supporting the rocker member.

The cranks also include upwardly extending arms 108 pivotally connected at 109 to the connecting rods 102 and 103. The connecting rods 102 and 103 support the carriage 90 and are pivotally connected thereto by screws 110. Springs 112 are provided about the bolts 111 and have extending ends 113 which engage the top of the connecting rods and ends 114 which engage the top frame portion 115. These springs tend to cause movement of the cranks 100 and 101 in a clockwise direction causing the rocker arm 78 to tend to move to the left so that the projection 97 thereon engages the top portion 77 of the cradle arm. It can, therefore, be seen that the horizontal movement of the rocker arm 78 in response to movement of the cradle arm 74 is transmitted through the cranks and connecting rods to provide vertical movement of the carriage 90 so that the position of the cores with respect to the coils may be adjusted.

Considering now the operation of the tuning mechanism, it it apparent that the positions of the switch arm 60 and the carriage 90 are correlated so that various positions of the carriage correspond to the positions of the switch arm. The number of positions of the carriage for each position of the switch arm can be determined as desired. In present television practice, five channels are provided in the low frequency range and seven channels are provided in the high frequency range. Accordingly, the camming surfaces of the member 56 are arranged so that the switch arm 60 is in one position while five of the screws 73 are in engagement with the cradle arm 74 and in the other position while seven of the screws 73 are in engagement with the cradle arm. The screws are individually adjustable so that the positions of the cradle arm produced thereby provide the required positions of the cores to properly tune the receiver to the various channels. It is to be pointed out, however, that various other arrangements can be provided in the event that other frequency ranges and channel allocations may be desired.

It is to be noted that the tuner operating mechanism is constructed entirely of simple and inexpensive components. The screws 73 may be of the standard commercial type. The various components, such as the disks 57, 58, 71 and 72, arms 60, 74 and 78, cranks 100 and 101, and rods 102 and 103, may all be punched of sheet material. Similarly, the frame members may be made of sheet metal construction so that substantially all components are of very inexpensive construction. The assembly of the components is not critical so that highly skilled labor for assembly and adjustment is not required. In systems actually constructed, the variations in movement of the core, due to inaccuracies in construction of the components and in the setting of the shaft, are of the order of 1/1000 of an inch, which provide entirely satisfactory operation. Such results were obtained when the various components were manufactured with the usual standard tolerances with no special precise work being required.

While there is described one embodiment of the invention which is illustrative thereof, it is obvious that various changes and modifications can be made therein without departing from the intended scope of the invention as defined in the appended claims.

I claim:

1. Tuning apparatus for a television receiver which is adapted for operation on a plurality of individual channels in each of two frequency ranges, and which includes a circuit having first tuning elements with movable members for selecting channels in one frequency range and second tuning elements with movable members for selecting channels in the other frequency range and switch means for selectively connecting said first and said second tuning elements in the receiver circuit; said tuning apparatus comprising in combination, a rotatable shaft, first cam means on said shaft including first and second portions individually corresponding to said frequency ranges, a first member connected to said switch means and positioned to be engaged by said first cam means, said first member operating said switch means for selectively connecting said first and second tuning elements in said receiver circuit in response to rotation of said shaft to positions in which said member is adjacent said first and second portions respectively, second cam means on said shaft having a plurality of individually defined angularly spaced portions corresponding to said channels in said two frequency ranges, and a second member having a portion connected to said movable members of all said tuning elements and engaging said portions of said second cam means for moving said tuning elements to positions corresponding to each of said channels in response to rotation of said shaft.

2. Tuning apparatus for a television receiver which is adapted for operation on a plurality of individual channels in each of two frequency ranges, and which includes a circuit having first tuning elements with movable members for selecting channels in one frequency range and second tuning elements with movable members for selecting channels in the other frequency range and switch means for selectively connecting said first and said second tuning elements in the receiver circuit; said tuning apparatus including in combination a rotatable shaft, first cam means on said shaft having a first pair of axially spaced discs having projections thereon extending between said discs, a first member connected to said switch means and having a portion extending between said first pair of discs, said projections being spaced to engage said portion of said first member and move the same between first and second positions in response to rotation of said shaft for operating said switch means and selectively connecting said first and second tuning elements in said receiver circuit, second cam means on said shaft having a second pair of axially spaced discs and a plurality of angularly spaced screws threaded in said discs and having surfaces adjustable to positions corresponding to said channels in said two frequency ranges, and spring biased means having a portion connected with said movable members of all said tuning elements and engaging said surfaces of said screws of said second cam means for moving said tuning elements to positions corresponding to said channels in response to rotation of said shaft.

3. Tuning apparatus for a television receiver which includes first tuning elements having movable members for selecting any one of a plurality of channels in a first frequency range, second tuning elements having movable members for selecting any one of a plurality of channels in a second frequency range and switch means for selectively rendering said first and second tuning elements operative; said tuning apparatus comprising a rotatable shaft, first cam means on said shaft including first and second sections which extend over arcs which are proportional to the number of channels in said first and second frequency ranges respectively, a first member connected to said switch means and engaging said first cam means and movable thereby between first and second positions for selectively rendering said tuning elements of said first and second ranges operative in response to rotation of said shaft, second cam means on said shaft including a plurality of adjustable portions having surfaces movable to positions individually corresponding to each of said channels in said frequency ranges, and mechanical means including a sliding carriage connected to said movable members of all said tuning elements and a pivoted arm engaging said surfaces of said second cam means and means interconnecting said arm and said carriage for moving said tuning elements in response to rotation of said shaft, and detent means engaging said second cam means for holding the same in positions in which said surfaces of said adjustable portions hold said carriage in positions corresponding to said various channels, said first and second cam means being so positioned on said shaft that when said second member engages portions corresponding to channels in said first frequency range said first member is in said first position and said first tuning elements are rendered operative, and when said second member engages portions corresponding to said second frequency range said first member is in said second position and said second tuning elements are rendered operative.

4. Tuning apparatus for a television receiver which includes first tuning elements having movable members for selecting any one of a plurality of channels in a first frequency range, second tuning elements having movable members for selecting any one of a plurality of channels in a second frequency range and switch means for selectively rendering said first and second tuning elements operative; said tuning apparatus comprising in combination, a rotatable shaft, first cam means on said shaft including first and second sections which extend over arcs which are proportional to the number of channels in said first and second frequency ranges respectively, a first member connected to said switch means and engaging said first cam means and movable thereby between first and second positions for selectively rendering said tuning elements of said first and second ranges operative in response to rotation of said shaft, second cam means on said shaft including a plurality of angularly spaced adjustable portions having surfaces movable to positions individually corresponding to said channels in both said frequency ranges, and a second member connected to said movable members of all said tuning elements and engaging said surfaces of said second cam means for moving said tuning elements to positions corresponding to said various channels in response to rotation of said shaft, said first and second cam means being so positioned on said shaft that when said second member engages portions corresponding to channels in said first frequency range said first member is in said first position and said first tuning elements are rendered operative, and when said second member engages portions corresponding to channels in said second frequency range said first member is in said second position and said second tuning elements are rendered operative.

5. Tuning apparatus for a television receiver which includes first tuning elements having movable members for selecting any one of a plurality of channels in a first frequency range, second tuning elements having movable members for selecting any one of a plurality of channels in a second frequency range and switch means for selectively rendering said first and second tuning elements operative; said tuning apparatus comprising in combination, a movable unit including a first portion having first and second sections which are proportional in extent to the number of channels in said first and second frequency ranges respectively, a first member connected to said switch means and engaging said first portion and movable between first and second positions in response to movement of said unit for selectively rendering operative said tuning elements of said first and second ranges, said unit including a second portion having a plurality of adjustable elements with surfaces movable to positions individually corresponding to said channels in both said frequency ranges, and a second member connected to said movable members of all said tuning elements and engaging said surfaces of said second portion for moving said tuning elements to positions corresponding to said various channels in response to movement of said unit, said first and second portions being of such configuration that when said second member engages surfaces of said second portion corresponding to channels in said first frequency range said first member is moved to said first position and said first tuning elements are rendered operative, and when said second member engages surfaces of said second portion corresponding to channels in said second frequency range said first member is moved to said second position and said second tuning elements are rendered operative.

6. Tuning apparatus for an electronic receiver which is adapted for operation on a plurality of channels in each of a plurality of frequency ranges for tuning said receiver to any one of said channels, said tuning apparatus comprising in combination, a movable unit including a first portion having a plurality of sections corresponding to said frequency ranges, a first member positioned to be engaged by said first portion and movable thereby to positions corresponding to said frequency ranges for selecting said frequency ranges, said unit including a second portion having a plurality of spaced adjustable elements having surfaces movable to positions individually corresponding to said channels in all of said frequency ranges, an arm positioned to be engaged by said surfaces of said second portion and movable thereby to positions corresponding said various channels for selecting said channels, said unit being movable to predetermined positions in each of which said arm is engaged by the surface of one of said adjustable elements and moved to a position corresponding to one of said channels, said sections of said first portion being spaced so that said first member is moved by said first portion into the position corresponding to the frequency range of the channel selected by said second portion.

7. Tuning apparatus for an electronic receiver which is adapted for operation on a plurality of frequency channels in each of a plurality of frequency ranges for tuning said receiver to any one of said channels, said tuning apparatus comprising in combination, a rotatable shaft, first cam means on said shaft having portions corresponding to said frequency ranges, a first member positioned to be engaged by said portions of said first cam means and movable thereby to positions corresponding to said frequency ranges for selecting said frequency ranges, second cam means on said shaft including a plurality of angularly spaced adjustable members having surfaces individually movable to positions corresponding to said channels in all of said frequency ranges, an arm positioned to be engaged by said surfaces of said second cam means and movable thereby to positions corresponding to said various channels for selecting said channels, said shaft being rotatable to predetermined angular positions in which said arm is moved by the surface of one of said adjustable members to a position corresponding to one of said channels, said portions of said first cam means being of such configuration that said first member is moved to the position corresponding to the frequency range of the channel selected.

8. Tuning apparatus for an electronic receiver which is adapted for operation on a plurality of frequency channels in each of a plurality of frequency ranges for tuning said receiver to any one of said channels, said tuning apparatus comprising in combination, a rotatable shaft, first cam means on said shaft having portions corresponding to said frequency ranges, a first member positioned to be engaged by said portions of said first cam means and movable thereby to positions corresponding to said frequency ranges for selecting said frequency ranges, second cam means on said shaft including a pair of axially spaced discs with a plurality of radially positioned members threaded therein, said threaded members having surfaces movable to positions individually corresponding to said channels in all of said frequency ranges, an arm positioned to be engaged by said surfaces of said threaded members, means biasing said arm against the surfaces of said threaded members to positions corresponding to said various channels, said arm having a flat portion and slanting portions on either side thereof, said surfaces of said threaded members individually moving said arm by engagement with one of said slanting portions as said shaft is rotated, and means for holding said shaft in positions in which said flat portions of said arm are held by the surfaces of said threaded members in positions corresponding to said channels, said portions of said first cam means being of such configuration that said first member is moved to the position corresponding to the frequency range of the channel selected.

EMERY L. HALL.

REFERENCES CITED

The following references are of record in the file of this patent:

UNITED STATES PATENTS

| Number | Name | Date |
|---|---|---|
| 1,951,542 | Bradley | Mar. 20, 1934 |
| 2,235,195 | Bell | Mar. 18, 1941 |
| 2,251,068 | Rinia | July 29, 1941 |
| 2,272,050 | Horowitz | Feb. 3, 1942 |
| 2,379,284 | Dimmer | June 26, 1945 |
| 2,424,506 | Sands | July 22, 1947 |

FOREIGN PATENTS

| Number | Country | Date |
|---|---|---|
| 382,076 | Great Britain | Oct. 26, 1932 |
| 392,469 | Great Britain | May 18, 1933 |